United States Patent [19]

Inoue et al.

[11] 3,951,652

[45] Apr. 20, 1976

[54] METHOD OF FORMING IMAGE ON SULFUR BASED PHOTOSENSITIVE MEMBER

[75] Inventors: Eiichi Inoue, Tokyo; Takao Nakayama, Yokohama; Taiji Nose, Koshigaya, all of Japan

[73] Assignee: Fuji Photo Film Co., Ltd., Minami-ashigara, Japan

[22] Filed: July 17, 1974

[21] Appl. No.: 489,289

[30] Foreign Application Priority Data

July 17, 1973 Japan.................................. 48-81623

[52] U.S. Cl. .............................. 96/1 R; 96/27 R; 96/48 HD; 96/88; 96/28
[51] Int. Cl.² .................. G03G 13/00; G03C 5/04; G03C 5/24; G03C 1/00
[58] Field of Search ......... 96/1 R, 27 R, 88, 48 HD, 96/28

[56] References Cited
UNITED STATES PATENTS

| | | | |
|---|---|---|---|
| 2,297,691 | 10/1942 | Carlson | 96/1 R |
| 3,305,359 | 2/1967 | Delmont | 96/1 R |
| 3,306,745 | 2/1967 | Webers | 96/115 P |
| 3,471,309 | 10/1969 | Thompson | 117/37 LE |
| 3,617,324 | 11/1971 | Thomas | 117/1.7 |

OTHER PUBLICATIONS

Berraz et al., *Chemical Abstracts* 36: 5698⁸, 1942.

*Primary Examiner*—Jack P. Brammer
*Attorney, Agent, or Firm*—Sughrue, Rothwell, Mion, Zinn & Macpeak

[57] ABSTRACT

A method of forming an image comprising imagewise exposing a sulfur based-photosensitive member comprising a support having thereon a thin layer mainly comprising a sulfur which is physically changeable on absorbing the energy of light, to thereby produce a difference in respect to solvent solubility, powder adhering property, or sublimation between the exposed area and the non-exposed area and then selectively utilizing the difference between the exposed area and the non-exposed area to form an image, i.e., removing an area of higher solubility by dissolving the area with a solvent, adhering a toner only on an area of higher powder adhering property, or subliming only an area of higher sublimation property.

4 Claims, No Drawings

METHOD OF FORMING IMAGE ON SULFUR BASED PHOTOSENSITIVE MEMBER

BACKGROUND OF THE INVENTION

1. Field of the Invention

The present invention relates to a sulfur-based photosensitive member. More particularly, the present invention relates to a sulfur-based photosensitive member wherein a form of sulfur which is physically changeable on absorbing the energy of light is used as a photosensitive material.

2. Description of the Prior Art.

Heretofore, various materials such as silver halides, diazo compounds, organic elemental compounds, or photosensitive resins, etc. have been used as the photosensitive material for photosensitive members. The photosensitive members prepared using these materials are expensive since the production cost of these materials is high. Moreover, the starting materials of photosensitive materials, such as silver, are in short supply at the present time and their prices are soaring worldwide and thus they are not suitable for producing photosensitive members of low cost. Furthermore, since some starting materials are poisonous, problems of pollution in producing the photosensitive members tend to occur.

Conventional photosensitive members have various advantages such as high sensitivity, capability to reproduce a half-tone image, etc. However, even though a photosensitive member is deficient in its qualities, e.g., the sensitivity, image properties, etc., are not improved to the level attained with conventional photosensitive members, if the photosensitive member is sensitive to the extent that it can be used with copying machines on the market without difficulty and moreover if a line copy of the member is possible although a half-tone copy is not possible, it is commercially usable in some fields of application. A diazo photosensitive member is an example of such a photosensitive member. A diazo photosensitive member, however, also is high in cost. In actuality, the advantage of this type of photosensitive member resides in its low cost.

Without going into great detail, at the present time, petroleum is consumed in a large amount and the refining of petroleum is carried out with large sized machines on a large scale. At the desulfurizing stage, a large amount of sulfur is by-produced and the supply of sulfur now exceeds its demand. Thus, an important area of interest is how to effectively use the excessive sulfur, since sulfur will necessarily cause environmental pollution.

Heretofore, it has been reported that sulfur has 30 or more allotropic forms, but with the exception of certain specific forms, their structures and properties have not been clarified. With regard to the photoproperties of sulfur, only the facts that sulfur undergoes photopolymerization in solution; that on irradiating sulfur in the solid state with $\alpha$-rays, $\beta$-rays, $\gamma$-rays, or ultraviolet rays, a radioactive sulfur of a short life is produced; that sulfur is photoconductive; and that on heat-melting, sulfur undergoes phase changes and reaches a supercooled condition, etc. are known. Of these findings, the photoconductivity and the ability to achieve a supercooled condition are utilized in a process for forming an image. That is, the following methods are described in U.S. Pat. No. 2,297,691. One method comprises forming a thin layer of sulfur on a support by melting and cooling, placing the thin layer in a dark place, applying an imagewise exposure to the layer when the electric resistance of the layer has sufficiently increased, to thereby form an image due to the difference in the electric resistance of the thin layer, charging the non-exposed area where the electric resistance is high, and then adhering electrostatically colored powders onto the above area to thereby form a visible image. Another method comprises forming a crystalline sulfur layer on a support, heating the layer in an imagewise manner to thereby imagewise melt the layer so as to cause a phase change and supercooling therein and then adhering powder on the area to thereby form a visible image.

However, since the sensitivity of the sulfur layer used is low and for various reasons, neither of these processes have been commercialized.

In view of the present situation of sulfur as a starting material and the development situation with respect to specific applications, the fields of application of sulfur have not yet been opened up. Upon investigation of new fields utilizing sulfur, it has now been found that certain kinds of sulfur possess photosensitivity and undergo material and constructional variation on absorbing the energy of light, thereby changing their physical properties.

SUMMARY OF THE INVENTION

Accordingly, an object of the present invention is to provide a novel process for forming an image.

Another object of the present invention is to open up a new field of application of sulfur which is in an excessive supply at the present time.

Another object of the present invention is to provide a very inexpensive photosensitive member.

These and other objects will become apparent from the following description.

These objects can be attained by using a form of sulfur which is physically changeable on absorbing the energy of light as a photosensitive material.

The present invention provides a process for forming an image which comprises imagewise exposing a sulfur based photosensitive member, comprising a support having thereon a layer mainly composed of sulfur which is in the amorphous solid state and is physically changeable on absorbing the energy of light, to thereby produce a significant difference with respect to solvent solubility, powder adhering property, or sublimation between the exposed area and the non-exposed area; and selectively utilizing this difference to form a visual image prepared above.

DETAILED DESCRIPTION OF THE INVENTION

A feature of the present invention is to use sulfur which is, as described above, in an amorphous solid state and is physically changeable on absorbing the energy of light. Sulfur is a well-known material, in which the sulfur molecules, which are generally said to form 8-membered rings, are considered to aggregate randomly, and sulfur is chemically unstable. Thus, it can be considered that the 8-membered ring molecule is easily cleaved on absorbing the energy of light, thereby changing its chemical and physical properties. For instance, in some cases, it can be concluded from test results obtained that the sulfur in the amorphous solid state polymerizes on absorbing the energy of light, thereby producing a straight chain polymer of sulfur. The mechanism of the polymerization is as follows:

1. Photocleavage reaction of the 8-membered ring $S_8$ (cyclic molecule) $\xrightarrow{h\nu}$ .SSSSSSSS. (straight chain biradical)
   (referred to as $S_8{}^{(r)}$)      (referred to as $S_8{}^{(d)}$)

2. Initiation reaction of polymerization of radical
   $S_8{}^{(d)} + S_8{}^{(r)} \longrightarrow S_{16}{}^{(d)}$ 3. Polymerization reaction (where n is a positive integer)
   recurring reaction
   $S_{8n}{}^{(d)} + S_8{}^{(r)} \longrightarrow S_{8(n+1)}{}^{(d)}$ (straight chain sulfur polymer)

The average degree of polymerization of the thus prepared straight chain polymeric sulfur is believed to reach $10^5$ as $S_8$ units, but this has not been experimentally confirmed. It has been, however, confirmed from other test results that the amorphous polymeric sulfur prepared by heat-polymerization followed by rapid cooling easily crystallizes while the sulfur prepared by photopolymerization is sufficiently stable for several days.

The above-described photopolymerization mechanism is well supported by a great deal of various test results, but the real mechanism is completely unclear. It can be also considered that the sulfur molecules in a random aggregation absorb the energy of light, changing to another condition, e.g. crystallizing, without a cleavage of the 8-membered sulfur ring.

From the fact that the X-ray diffraction pattern of the sulfur is very similar to that of the hitherto known amorphous sulfur, it can be judged that sulfur which is photosensitive is non-crystalline, i.e., in the amorphous condition. Infrared analysis of the sulfur indicates a broad absorption in the near ultraviolet region of 280 to 400 m$\mu$ in wave length.

The above mentioned sulfur layer is provided on a support by methods such as the vapor-depositing of sulfur, coating of a sulfur solution, or coating of molten sulfur, etc. In the vapor-depositing of the sulfur on the support, the support and the sulfur are placed in a vacuum vapor-depositing apparatus, in which the pressure is reduced to about $10^{-1}$ to $10^{-5}$ Torr, and then the sulfur is heated at about 100° to 300°C until the desired thickness of the vapor-deposited layer is formed. In case of the solution method, the sulfur is dissolved in one or more organic solvents such as chloroform; carbon disulfide; halogenated hydrocarbons (for example, carbontetrachloride, trichloroethylene and the like); and aromatic hydrocarbons such as benzene, toluene, styrene, xylene, ethylbenzene isopropylbenzene, p-cymene, and the like, e.g., in an amount of about 0.2 to 10 weight %; and then coated on the support. In order to control the solution composition depending upon the coating method and to improve working conditions such as decreasing pollution problems, danger in handling, economics, polar or non-polar solvents such as water, acetonitrile, dioxane, ethyl ether, ethyleneglycol monoether, dimethylformamide, dimethylacetamide, dimethylsulfoxide, N-methylpyrrolidone, hexane, decalin, acetic acid, and the like can be added within a range which does adversely affect the photosensitivity. The solvents used and the amounts thereof can be determined by one skilled in the art considering volatility, inflammability, odor, boiling point, solubility, price, effect, etc.

Where the molten sulfur is coated on the support and quenched to form the photosensitive sulfur layer, sulfur powder is first melted in a vessel and then coated on the support. In this case, when a heat-stable support is used as the support, the sulfur powder can be melted directly on the support and spread, and then an excess of the sulfur is removed to thereby produce a thin photosensitive sulfur layer.

The amount of the sulfur contained in the sulfur layer provided on the support is not limited, but too small an amount generally reduces the sensitivity. Thus, a suitable amount generally ranges from about $10^{-7}$ g/cm$^2$ to about $10^{+1}$ g/cm$^2$ and, preferably from about $10^{-5}$ g/cm$^2$ to $10^{-1}$ g/cm$^2$.

The photosensitive layer can comprise the sulfur alone or can contain other ingredients as well as the sulfur. For instance, the photosensitive layer preferably contains sensitizers. As the sensitizer, those which can extend the spectral sensitizing wave length region, i.e., spectral sensitizers and sensitizers which can increase the absorption in the wavelength range of intrinsic sensitivity, etc., are particularly useful although substantially all of compounds having a sensitizing effect can be used. Where an organic compound is used as a sensitizer, organic compounds containing a carbonyl group, particularly a thiocarbonyl group, an amino group, particularly a carbamoyl group, a dialkylamino group, and the like can be used. Representative examples are thiobenzophenone derivatives such as thiobenzophenone, N,N'-dimethylaminobenzophenone, N,N'-diethylaminothiobenzophenone, p,p'-dimethoxythiobenzophenone, 4,4'-tetramethyldiaminothiobenzophenone (Michler's thioketone), etc.; and thiocarbamoyl group containing compounds such as thiourea, thiobenzoylamide, phenylthiourea, and the like, etc. The amount of the sensitizer is preferably in the range of about $10^{-4}$ to 20% by weight, preferably about $10^{-3}$ to 8% by weight, based on the sulfur.

Any support on which the sulfur can be provided, alone or in combination with binders, can be used in the present invention. For example, paper, laminated paper; plastic films such as polyamide films, polyester films, polyvinyl butyral films, and the like; metal plates such as zinc plates, aluminum plate, steel plate and the like; etc. can be used.

As a light source for use in exposure, light sources capable of generating electromagnetic waves or corpuscular rays can be used. For example, a xenon lamp, sunlight, a mercury lamp, a carbon arc lamp, and the like are suitable. A suitable exposure can be to light having a wavelength of about 280 to 400 nm and where sensitizers are used about 250 to 500 nm. A suitable amount of exposure can range from about 1000 lux.-sec. to 500,000 lux.sec. The photosensitive member of the present invention after exposure is, if necessary, subjected to a developing treatment. Although the treatment is not necessarily required, solvents such as those solvents as described above which are capable of dissolving the photosensitive member or the sulfur are used in the treatment, whereby the non-exposed area can be easily removed. At this time, if other ingredients such as sulfur are added to the solvent, the non-exposed area is removed and the other ingredients are deposited on the exposed area, whereby an image can be produced using the amplifying effect due to the development. The development can be carried out by heating. That is, the exposed photosensitive layer is overlaid on a sheet such as those supports as described above and heated, e.g., at a temperature of about 70°C to 150°C, from the side of the support, from the side of the sheet, or from both sides for about 0.1 to 10 seconds, whereby the exposed area is left on the support and the non-exposed area is transferred to the sheet. Moreover, at the time, if the image transferred to the sheet is entirely exposed, it can be easily made visible as described hereinafter. Thus, with a development by heating, a positive image and a negative image can be produced simultaneously. It goes without saying that the photosensitive layer can be overlaid on a sheet after moistening with a solvent and heated or that the photosensitive layer interposed between two sheets is exposed and then peeled off to effect the development.

The image can be easily rendered visible by supplying powders onto the photosensitive layer although this is not necessarily required for some purposes.

That is, an advantage of the present invention is that all kinds of powders can adhere selectively onto the exposed area of the photosensitive layer. Representative examples of these powders include dyes, pigments, metal powders, polymer powders and the like, and more specifically, Rose Bengale, Crystal Violet, metal powders such as copper powder, aluminum powder, silver halide powder, zinc powder, and the like, oxides or sulfides of iron, copper, zinc, cadmium, lead, and the like, or toners for electrophotography can be used. In addition, metals or metal salts which react with the sulfur can be used. The amount of these powders is will vary widely depending on the purpose and it is sufficient to use at least that an amount required to render the image visible. The grain size will vary depending upon the kind of the powder and the purpose thereof, but grain size not larger than 1500 microns is generally suitable and preferably not larger than about 200 microns from the standpoint of resolution. The grain size will generally be about 30 microns or larger but this limit is not critical and smaller grain sizes can be used if desired.

The photosensitive layer can contain other ingredients such as binders, such as chlorinated rubber, polyvinyl alcohol, polystyrene, polyvinyl chloride, fillers such as inorganic pigments, or metal pigments such as copper, silver, aluminum, selenium, zinc, tellurium, tin, etc., organic pigments and the like, can be used. The amount of these ingredients can be varied widely but the amount should not significantly reduce the photosensitivity. For example, a suitable amount ranges from about $10^{-4}$ to 10% by weight.

The present invention will be further described in greater detail by reference to the following examples. Unless otherwise indicated, all parts, percents, ratios and the like are by weight.

EXAMPLE 1

0.2 g of sulfur powder was weighed, dissolved in 100 ml of toluene, coated on a tengujo-shi (Japanese) paper, and dried. A sulfur layer in a dry thickness of $10^{-5}$ g/cm$^2$ was formed. A negative film (original) was superposed on the sulfur layer and exposed to sunlight for about 30 seconds. Immediately, fine carbon black powder (average grain size of about 0.1 $\mu$) was sprayed on the sulfur layer and then air was blown over the sulfur layer to remove an excess of the powder. Thus, the carbon black powder adhered only to the exposed area and a visible image was obtained.

EXAMPLE 2

A sulfur-based photosensitive member produced in the same manner as set forth in Example 1 was exposed to a mercury lamp of a 250 W output at a distance of 25 cm for about 1 second. Immediately, on affecting the same powder development as set forth in Example 1 using a fine powder of Rose Bengale (average grain size of about 0.2 $\mu$) instead of the carbon black powder, the powder adhered only to the exposed area and thus a clear visible image was obtained.

EXAMPLE 3

The procedure of Example 2 was repeated except that a polyethylene terephthalate film was used as the support. Similar results were obtained.

EXAMPLE 4

0.6 g of sulfur powder was weighed and N,N'-dimethylaminobenzophenone was added to the sulfur powder as a sensitizer in an amount equivalent to 1% by weight of the sulfur powder, and the mixture was uniformly mixed. The procedure of Example 1 was repeated using this composition to thereby produce a sulfur based photosensitive member. The coverage of the sulfur layer was about $10^{-4}$ g/cm$^2$ on a dry basis.

The thus prepared photosensitive member was exposed to the same light source as used in Example 2 for about 1/20 th of a second. The member was divided into three pieces and the following tests were conducted.

1. Test Piece 1: On applying the same procedure as used in Example 2 to Test Piece 1, a clear image of Rose Bengale was obtained.

2. Test Piece 2: On treating Test Piece 2 with a toluene solution of sulfur (a concentration of about 2% by weight), the sulfur at the non-exposed area was dissolved in the solution while the sulfur at the exposed area was not dissolved and it was observed that the sulfur in the solution deposited on the exposed area.

3. Test Piece 3: Test Piece 3 was washed with xylene to remove the non-exposed area of the sulfur layer and dried. On applying powder development using carbon black (average grain size of about 0.2 $\mu$) to Test Piece 3, the powder adhered onto the image formed by the sulfur at the exposed area. Thus, a clear image of high contrast was obtained. When the sulfur forming the image was melted by heating, the powder image became quite stable. This is due to the fact that the powder was adhered together by the molten sulfur.

4. Test Piece 4: Test Piece 3 was again heated to soften the stabilized powder image thereof and in this state, it was pressed to a tengujo-shi paper. Thus, the powder image was transferred to the tengujo-shi paper.

5. Test Piece 5: In the same manner as described for Test Piece 3, a sulfur image was formed and a tengujo-shi paper was superposed on the resulting sulfur image. When they were heated in this state from the side of Test Piece 5, the sulfur at the non-exposed area sublimed and adhered to the superposed tengujo-shi paper. Thus, a transferred image was obtained.

The transferred image of the sublimed sulfur was exposed and developed by powder-spraying using a fine Crystal Violet powder (average grain size of 0.2 $\mu$) and then a clear image was obtained. This image could be used as a master for sprit printing and printings of several tens of sheets were obtained.

6. Test Piece 6: A sulfur image was formed in the same manner as described for Test Piece 3 and on the resulting image, a copper plate was superposed. They were heated from the side of Test Piece to sublime the sulfur image to the copper plate and thus, by the reaction of the copper plate and the sublimed sulfur, copper sulfide was formed. Thus, a black image was obtained on the copper plate.

EXAMPLE 5

The procedure of Example 1 or 4 was repeated except that 10 mg of sulfur was vapor-deposited on an aluminum plate of a size of 30 cm × 30 cm ($10^{-2}$ to $10^{-3}$ Torr, 500°C, 10 seconds). Thus, substantially same results were obtained.

EXAMPLE 6

The procedure of Example 4 was repeated except that thiourea was used as the sensitizer and using an exposure time of $5 \times 10^{-1}$ seconds. In this case, by spraying toners for electrophotography comprising carbon black and a synthetic polymer compound, a clear image was obtained.

EXAMPLE 7

0.4 g of sulfur powder was weighed, dissolved in 100 ml of carbon disulfide, coated on an art paper, and dried to thereby produce a sulfur photosensitive layer. The coating amount of the sulfur was $10^{-4}$ g/cm². The resulting photosensitive layer was imagewise exposed as described in Example 2. When iron, copper, zinc, tin, and aluminum powders of an average grain size of 20 to 50 μ were sprayed locally on the photosensitive layer, they adhered to the exposed area of the sulfur photosensitive layer and the powder on a non-exposed area could be removed. Thus, visible images of various metal powders were produced on the photosensitive layer.

While the invention has been described in detail and with reference to specific embodiments thereof, it will be apparent to one skilled in the art that various changes and modifications can be made therein without departing from the spirit and scope thereof.

What is claimed is:

1. A process for forming an image which comprises (1) imagewise exposing a sulfur-based photosensitive member comprising a support having thereon a layer consisting essentially of sulfur in an amorphous solid state and physically changeable on absorbing the energy of light to produce a difference in respect to sublimation characteristics between the exposed area and the non-exposed area, and, (2) heating said imagewise exposed sulfur-based photosensitive member to a temperature of between about 70 to 150°C to sublime the area of higher sublimation characteristics.

2. The process for forming an image according to claim 1, including (3) adhering a toner to the sulfur image after said heating step (2).

3. The process for forming an image of claim 1, including superposing a sheet member on said sulfur based photosensitive member, between steps (1) and (2) such that during said heating step (2) sublimed sulfur is transferred to said sheet member to form a transferred image.

4. The process for forming an image according to claim 3, including (3) adhering a toner to said transferred image.

* * * * *